(12) United States Patent
Muto et al.

(10) Patent No.: US 6,906,394 B2
(45) Date of Patent: Jun. 14, 2005

(54) METHOD OF MANUFACTURING SEMICONDUCTOR DEVICE CAPABLE OF SENSING DYNAMIC QUANTITY

(75) Inventors: Hiroshi Muto, Nagoya (JP); Tsuyoshi Fukada, Aichi-ken (JP); Kenichi Ao, Tokai (JP); Minekazu Sakai, Kariya (JP); Yukihiro Takeuchi, Aichi-ken (JP); Kazuhiko Kano, Toyoake (JP); Junji Oohara, Nisshin (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/448,277

(22) Filed: May 30, 2003

(65) Prior Publication Data

US 2003/0201506 A1 Oct. 30, 2003

Related U.S. Application Data

(62) Division of application No. 10/154,784, filed on May 28, 2002, now Pat. No. 6,753,201.

(30) Foreign Application Priority Data

May 28, 2001 (JP) ........................................ 2001-159492

(51) Int. Cl.⁷ .................... H01L 27/01; G01P 15/125
(52) U.S. Cl. .................... 257/415; 257/347; 257/619; 73/514.32
(58) Field of Search .................. 73/514.32; 257/415, 257/347, 619

(56) References Cited

U.S. PATENT DOCUMENTS

| | | | |
|---|---|---|---|
| 4,622,094 A | 11/1986 | Otsubo | |
| 5,316,979 A | 5/1994 | MacDonald et al. | |
| 5,576,250 A | 11/1996 | Diem et al. | |
| 5,578,755 A | 11/1996 | Offenberg | |
| 5,747,353 A | 5/1998 | Bashir et al. | |
| 6,071,822 A | 6/2000 | Donohue et al. | |
| 6,177,701 B1 | 1/2001 | Matsumoto | |
| 6,187,685 B1 | 2/2001 | Hopkins et al. | |
| 6,287,885 B1 | 9/2001 | Muto et al. | |
| 6,365,056 B1 | 4/2002 | Robert et al. | |
| 6,373,632 B1 | 4/2002 | Flanders | |
| 6,399,516 B1 | 6/2002 | Ayon | |
| 6,494,096 B2 * | 12/2002 | Sakai et al. | 73/514.32 |
| 6,528,724 B1 | 3/2003 | Yoshida et al. | |
| 6,753,201 B2 * | 6/2004 | Muto et al. | 438/48 |
| 2002/0096258 A1 | 7/2002 | Savas et al. | |
| 2002/0102775 A1 | 8/2002 | Houng et al. | |
| 2003/0201506 A1 * | 10/2003 | Muto et al. | 257/415 |

FOREIGN PATENT DOCUMENTS

| | | |
|---|---|---|
| JP | A-3-242929 | 10/1991 |
| JP | 10-84119 | 3/1998 |
| JP | A-H11-067728 | 3/1999 |
| JP | A-11-067728 | 3/1999 |
| JP | 11-274142 | 10/1999 |
| JP | 12-31502 | 1/2000 |

OTHER PUBLICATIONS

Cornel Marxer et al.: "Vertical Mirrors Fabricated by Deep Reactive Ion Etching for Fiber–Optic Switching Applications" Journal of Microelectromechanical Systems, vol. 6, No. 3, Sep. 1997, pp. 277–285.

* cited by examiner

Primary Examiner—Mark V. Prenty
(74) Attorney, Agent, or Firm—Posz Law Group, PLC

(57) ABSTRACT

A method of manufacturing a semiconductor device is provided. The device is manufactured with use of an SOI (Silicon On Insulator) substrate having a first silicon layer, an oxide layer, and a second silicon layer laminated in this order. After forming a trench reaching the oxide layer from the second silicon layer, dry etching is performed, thus allowing the oxide layer located at the trench bottom to be charged at first. This charging forces etching ions to impinge upon part of the second silicon layer located laterally to the trench bottom. Such part is removed, forming a movable section. For example, ions to neutralize the electric charges are administered into the trench, so that the electric charges are removed from charged movable electrodes and their charged surrounding regions. Removing the electric charges prevents the movable section to stick to its surrounding portions.

6 Claims, 5 Drawing Sheets

METHOD OF MANUFACTURING SEMICONDUCTOR DEVICE CAPABLE OF SENSING DYNAMIC QUANTITY

The present application is a division of application Ser. No. 10/154,784, filed on May 28, 2002, now U.S. Pat. No. 6,753,201 entitled METHOD OF MANUFACTURING SEMICONDUCTOR DEVICE CAPABLE OF SENSING DYNAMIC QUANTITY, which is based upon and claims the benefit of Japanese Patent Application No. 2001-159492 filed on May 28, 2001, the contents of which are incorporated herein by reference.

BACKGROUND OF THE INVENTION

1. Technical Field

The present invention relates to a method of manufacturing a semiconductor device usable as a sensor, such as an acceleration sensor and an angular velocity sensor, that comprises a movable section formed in a semiconductor layer of a semiconductor substrate and displaceable in response to a dynamic quantity acting thereon.

2. Related Art

A conventional semiconductor device of this type has been for example disposed by Japanese Patent Application Laid-open No. 11-274142. This semiconductor device uses an SOI substrate formed as a semiconductor substrate, in which the substrate is composed of a first silicon layer (a first semiconductor layer), an oxide layer (insulation layer) layered on the first silicon layer, and a second silicon layer (a second semiconductor layer) layered on the silicone oxide layer.

For manufacturing the above semiconductor device, a trench to demarcate a movable section is formed. Specifically, a first step of dry etching is performed so that the trench is formed to reach the oxide layer from the surface of the second silicone layer. Then a second step of dry etching is performed to apply etching ions to a partial region of the second silicon layer, which is located laterally to the bottom of the trench. This etching allows the partial region of the second silicone layer to be removed, thus providing a movable section formed by the remaining area of the second semiconductor layer.

The foregoing manufacturing step of the movable section will now be detailed. Through the second step of try etching, which is done after forming the trench, a partial region of the insulating film, which is located at the bottom of the trench, is charged at first. This charge causes etching ions to be repelled during the dry etching continued, so that etching ions travel as they change their courses from the depth direction of the trench to the lateral direction orthogonal thereto. Accordingly, the etching ions are forced to impinge onto a partial region of the second semiconductor layer, which is located on the sides of the bottom. The partial region of the second semiconductor layer is thus subjected to the etching so that it is removed, providing a movable section above the insulation layer.

In the case of the technique disclosed by the above conventional patent publication, an etched depth is detected by utilizing movable sections formed dedicatedly to detecting the etched depth. The foregoing charging is used to stick (bond) the adjacent depth-detecting movable sections to each other.

However, the estimation of the foregoing manufacturing technique carried out by the inventors showed two problems.

One problem is that a sticking phenomenon may arise among members of the semiconductor substrate. In addition to the insulation layer at the trench bottom, the dry etching carried out after forming the trench charges not only the movable section responsible for a sensing part of the device but also the second semiconductor layer and insulation layer which are located oppositely to the trench via the movable section. This charging brings about an imbalanced charging distribution among such various members, so that there is a fear that the members are partly or entirely subjected to sticking phenomena to their surrounding members.

The other problem also relates to the sticking phenomenon due to deposits. During the performance of the dry etching to remove regions of the second semiconductor layer, which are located on the sides of the trench bottom, deposits that appear due to the etching ions may adhere on a region of the movable section, which is opposed to the insulation layer. The deposits are composed of for example polymers including fluorine, carbon and oxygen.

If the deposits adhere on the movable section, as stated above, both the movable section and the insulation layer are likely to be stuck to each other at the locations of the deposits. One reason is that the deposits make it narrow the distance between the movable section and the insulation layer.

In cases where the movable section which should operate as the sensing part to the device fall into the stuck state on account of the foregoing charging or deposits, it is no longer possible to make the movable section operate normally as the sensing part of the device.

SUMMARY OF THE INVENTION

The present invention, which has been made with due consideration to the foregoing drawbacks, is directed to an object of providing a method of manufacturing a semiconductor device that has a movable section formed by removing the surrounding parts of the bottom of a trench through dry etching is prevented from sticking to the surroundings.

In order to accomplish the above object, the present invention provides a method of manufacturing a semiconductor device having a semiconductor substrate. In the semiconductor substrate, an insulation layer is layered on a first semiconductor layer and a second semiconductor layer is layered on the insulation layer. A movable section is formed in the second semiconductor layer and displaceable in response to a dynamic quantity to be applied.

As one aspect, the manufacturing method comprises the steps of preparing the semiconductor substrate; forming a trench to demarcate the movable section within the prepared semiconductor substrate so that the trench reaches the insulation layer form a surface of the second semiconductor layer; and forming the movable section by performing dry etching on the trench-formed semiconductor substrate, during which the dry etching the insulation layer located at a bottom of the trench is charged to force etching ions of the dry etching to impinge onto part of the second semiconductor layer located laterally to the bottom of the trench, thus the laterally located part of the second semiconductor layer being removed to form the movable section. In addition, electric charges caused due to the charging of the insulation layer during the movable-section forming step are removed from at least one of the movable section, a region, which faces the movable section, of the second semiconductor layer, and a region, which faces the movable section, of the insulation layer.

Hence, even when the charging of the insulation layer carried out during the movable-section forming process causes various members other than the insulation layer, electric charges appearing on the members are removed. Such members include the movable section, a region, which faces the movable section, of the second semiconductor layer, and/or a region, which faces the movable section, of the insulation layer. The removal of the electric charges prevents the movable section from sticking to its surroundings.

It is not always required that the electric charges on the members be removed completely. As long as the movable section is prevented from sticking to its surroundings, a moderate level of removal of the electric charges is still enough.

By way of example, the electric charges may be removed by intermittently performing the dry etching during the movable-section forming step. In this case, during a certain time of period following a period of time for the dry etching, no dry etching is carried out, thus being left to stand so that the electric charges disappear. Since the electric charges appear every time the dry etching is performed intermittently are necessarily subject to a period of time for their disappearances. Thus, when the entire dry etching process is completed, electric charges are hardly left in the substrate, thereby preventing the movable section from sticking to its surrounding members.

In addition, for performing the dry etching in the intermittent manner as stated above, the electric charges may be removed by providing the electric charges with ions to neutralize the electric charges during each of the intermittent periods of time with no dry etching. This leads to the repeated alternating steps for both the performance of the dry etching and the administration of the neutralizing ions. The electric charges can therefore be removed in a more effective way. Negative ions such as oxygen ions are one example of such neutralizing ions.

Another technique for removing the electric charges is to leave the movable-section-formed semiconductor substrate during a period of time determined so that the electric charges disappear, after the movable-section forming step. Although electric charges are accumulated immediately after the movable-section forming step, that is, the step of the dry etching, the electric charges will disappear, with reliability, during a certain period of time for being left to stand. The movable section is thus prevented from sticking to its surrounding members.

Still another technique for removing the electric charges is providing the electric charges with ions to neutralize the electric charges after the movable-section forming step. Like the above, this technique is also effective in removing the electric charges, thus preventing the sticking phenomenon of the movable section.

There is sill another removing technique of the electric charges. That is, the electric charges can be removed, during the trench forming step, by placing an electrically conductive member on either of a region, which provides at least the movable section, of a surface of the second semiconductor layer or a region, which provides a partial region facing the movable section, of the second semiconductor layer. The electric charges to be appear on the movable section and/or a region, which faces the movable section, of the second semiconductor layer are able to disappear via the conductive member with effectiveness, thereby being effective in preventing or suppressing the sticking actions of the movable section.

For example, the conductive member may be used in common with a mask member for forming the trench.

In order to suppress or prevent the movable section from sticking to its surroundings due to deposits, not the foregoing electric charges, the following configurations are provided as another aspect of the present invention.

A first configuration is to clean up a region, which faces the insulation layer, of the movable section after the trench and movable-section forming steps. By this configuration, deposits on a region, which faces the insulation layer, of the movable section during the movable-section forming step can be taken out by the cleaning. The sticking phenomenon of the movable section, which is caused by the deposits, can therefore be avoided.

The removal of the deposits is also effective in securing smooth movements of the movable section, which is favorable to the characteristics of the semiconductor device. In detail, the above cleaning process can be performed in a vapor phase containing ions to remove organic substances, such as oxygen ions.

Still another aspect of the present invention is provided by the following configurations. Such aspect is directed to the suppression of sticking of the movable section due to the charging phenomenon caused during the movable-section forming step.

Practically, after both the trench and movable-section forming steps, a roughing step is carried out to roughen at least one of facing surfaces (13a, 24a) of both the movable section and the insulation layer, the facing surfaces are opposed to each other between the movable section and the insulation layer face. This roughing process is effective in reducing the contact areas of both the facing surfaces. In cases where the foregoing charging brings about a contact between the movable section and the insulation layer, a reduction in the contact areas allows a slight restoration force to separate both of the members from each other, thus preventing the sticking action of the movable section.

Preferably, in cases where the facing surface of the movable section is roughened, the roughing step is performed in a vapor phase containing ions to primarily etch the second semiconductor layer. In contrast, in cases where the facing surface of the insulation layer is roughened, the roughing step is performed in a vapor phase containing ions to primarily etch the insulation layer. Such ions may be for example fluorine ions.

BRIEF DESCRIPTION OF THE DRAWINGS

Other objects and aspects of the present invention will become apparent from the following description and embodiments with reference to the accompanying drawings in which.

DETAILED DESCRIPTION OF PREFERRED EMBODIMENT

Referring to the accompanying drawings, various preferred embodiments of the present invention will now be described.

First Embodiment

Referring to FIGS. 1 to 5, a first embodiment of the present invention will now be described.

Figure 1:
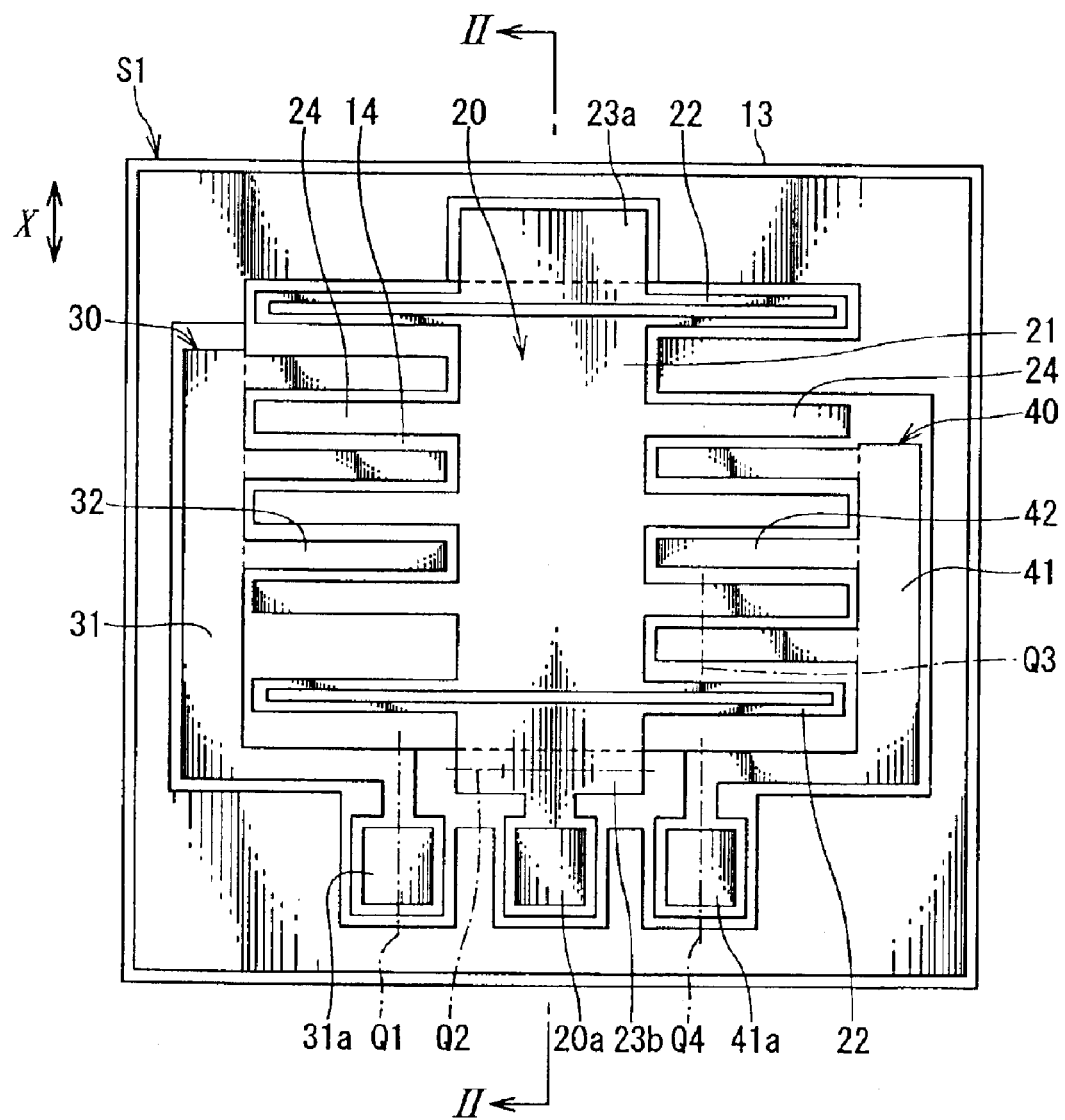
FIG. 1 shows an entire plan view of a semiconductor acceleration sensor, adopted as a semiconductor devise, according to a first embodiment of the present invention.
Figure 2:
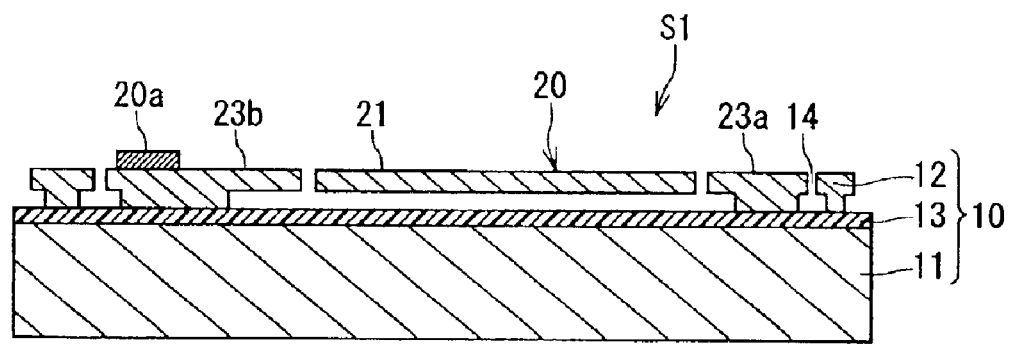
FIG. 2 is a sectional view taken along a II—II line in FIG. 1.
Figure 3:
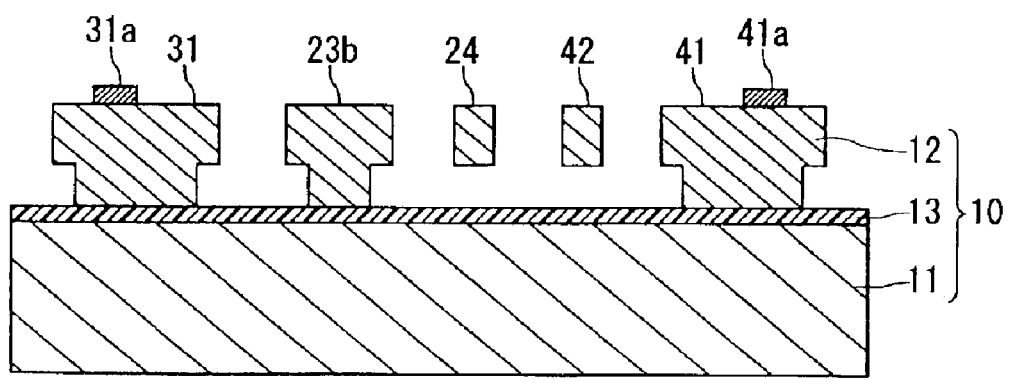
FIG. 3 is a sectional view formed by illustratively combining four partial sectional views taken along chain lines Q1 to Q4 in FIG. 1.

The first embodiment explains, as a semiconductor device according to the present invention, a differential capacity type of semiconductor acceleration sensor. FIG. 1 shows the entire plan view of a differential capacity type of semiconductor acceleration sensor S1 to which the present invention is applied. FIG. 2 shows a sectional view taken along a II—II line in FIG. 1. FIG. 3 is a sectional view formed by illustratively combining four partial sectional views taken along chain lines Q1 to Q4 in FIG. 1, so that FIG. 3 is adopted to show a pictorial sectional configuration of the sensor.

The semiconductor acceleration sensor S1 can be used as automobile-use acceleration sensors incorporated in control systems including air bag systems, ABS systems, and VSC systems, and gyro sensors.

The semiconductor acceleration sensor (hereafter referred to as a "sensor") S1 includes a semiconductor substrate, as shown in FIGS. 2 and 3. The semiconductor substrate is configured into a rectangular frame-like SOI (Silicon-On-Insulator)-structured substrate 10. Specifically, this substrate 10 has a first silicon layer 11 serving as a first semiconductor layer, an oxide layer 13 serving as an insulation layer, and a second silicon layer 12 serving as a second semiconductor layer, in which the oxide layer 13 is layered on the first silicon layer 11 and the second silicon layer 12 is layered on the oxide layer 13.

A trench 14 is formed through the second silicon layer 12, thus providing a beam structure, which is formed into a comb teeth shape, composed of a movable section 20 and fixed sections 30 and 40. The movable section 20 is composed of a single rectangular mass portion 21 and two beam portions 22 formed at both ends of the mass portion 21. The mass portion 21 is integrally coupled with anchor portions 23a and 23b via the beam portions 22.

As shown in FIGS. 2 and 3, both the anchors 23a and 23b are secured on the oxide 13 located beneath the second silicon layer 12. The movable section 20 (i.e., including the mass portion 21 and the beam portions 22), located between both anchor portions 23a and 23b, are separated from the oxide layer 13 located beneath the second silicon layer 12. Thus, the movable section 20 is formed so that both of the mass portion 21 and the beam portions 22 are suspended above the oxide layer 13 and supported by the anchor portions 23a and 23b secured on the oxide layer 13.

Each of the two beam portions 22 is configured into a rectangular frame made of two beams, but both ends of one beam are coupled with those of the other beam, respectively. Hence each beam portion 22 is able to function as a spring that can be displaced in an orthogonal direction to the longitudinal direction of each beam portion 22. To be specific, when an accelerated force including an acceleration component acting in an X-direction shown by arrows in FIG. 1 is applied to the sensor S1, the beam portions 22 allow the mass portion 21 to displace in the X-direction. In contrast, as such a force disappears, the beam portions 22 make the mass portion 21 return to its original position for restoration. Accordingly, the movable section 20 is able to operate using the anchor portions 23a and 23b as secured positions and to cause the mass portion 21 to displace in the X-direction in response to an application of an accelerated force, so that the acceleration acting in the X-direction can be sensed.

The mass portion 21 includes a plurality of movable electrodes 24, which are integrally formed with the mass portion 21, each extending from the sides of the mass portion 21 in the orthogonal direction to the displaceable direction of the beam portions 22 (i.e., the direction of the arrows X). The movable electrodes 24 are therefore arranged to protrude in a comb-teeth shape from the mass portion 21. FIG. 1 exemplifies the configuration in which the movable electrodes 24 is six in number and each set of three electrodes are protruded from each of the left and right sides of the mass portion 21.

Each movable electrode 24 is formed into a beam-like shape of which section is rectangular and, as shown in FIG. 3, is located separately from the oxide layer 13 by a certain distance (for example, a few micrometers). Thus, each movable electrode 24 is formed as one unit with the beam portions 22 and the mass portion 21 and is able to displace together with the mass portion 21 in the displaceable direction of the beam portions 22, thus being operated as part of the movable section 20.

The fixed sections 30 and 40, which are two in number, are arranged on both side of the mass portion 21. Further, the fixed sections 30 and 40 are secured on a second pair of opposite sides of the oxide layer 13, which are independent of supporting the anchor portions 23a and 23b secured on a first pair of opposite sides thereof. Thus, there are a first fixed section 30 located on the left side in FIG. 1 and a second fixed section 40 located on the right side in FIG. 1. Both of the first and second fixed sections 30 and 40 are therefore electrically isolated from each other.

The first fixed section 30 includes a wiring portion 31 and a plurality of fixed electrodes 32, while the second fixed section 40 includes a wiring portion 4 1and a plurality of fixed electrodes 42. Each of the wiring portions 31 and 41 is secured on the oxide layer 13 located beneath the wiring portions, which is thus supported by the first silicon layer 11.

The fixed electrodes belonging to each set of the fixed electrodes 32 (42) extend in a comb-teeth shape from a given side of each wiring portion 31 (41) toward the mass portion 21 along the orthogonal direction to the displaceable direction of the beam portions 22. That is, the protruded fixed electrodes 32 (42) are arranged to alternately engage with the movable electrodes 24 protruded from each side of the mass portion 21. In the example shown in FIG. 1, three fixed electrodes 32 (42) are arranged solidly from each of the wiring portions 31 and 41.

Each of the fixed electrodes 32 (42), which is formed into a beam which is rectangular in section, is supported by the wiring portion 31 (41) in a cantilever-held manner and located separately from the oxide layer 13 by a predetermined distance (for example, a few micrometers), as shown in FIG. 3. In addition, the fixed electrodes 32 (42) are arranged such that there is left a predetermined detection spacing between a side surface of each fixed electrode and a side surface of each movable electrode 24 located adjacently. Moreover, spatially required conditions are that each fixed electrode 32 (42) be arranged in parallel with each adjacent movable electrode 24 and opposed thereto.

Fixed-electrode pads 31a and 41a for wire bonding are formed on the wiring portions 31 and 41 at their predetermined positions, respectively. Further, a movable-electrode pad 20a for wire bonding is formed on one (23b) of the anchor portions 23a and 23b its predetermined position. Each of the electrode pads 20a, 31a and 41a is made of aluminum, for example.

Although now shown, the back surface of the first silicon layer 11 (that is, the opposite-side surface to the oxide layer 13) is secured onto a package with an adhesive or others. The package contains an electric circuit electrically connected to the foregoing electrode pads 20a, 31a and 41a by means of a wire bonding technique using gold or aluminum.

In the present embodiment, the fixed electrodes 32 of the first fixed section 30 are called "the first fixed electrodes," while the fixed electrodes 42 of the second fixed section 40 are called "the second fixed electrodes." A first capacity CS1 is formed between the first fixed electrodes 32 and the movable electrodes 24, while a second capacity CS2 is formed between the second fixed electrodes 42 and the movable electrodes 24.

In cases where an accelerated force acts on the sensor S1, the spring functions of the beam portions 22 permit the entire movable section 20 to displace as one unit in one of the arrow-X directions with the anchor portions 23a and 23b working as fulcrums. Depending on an amount of the displacement of the movable electrodes 24, the foregoing detection distances between the first and second fixed electrodes 32 and 42 and the movable electrodes 24 change, so that each of the capacities CS1 and CS2 changes responsively. Thus, the acceleration can be detected quantitatively based on a change in a differential capacity of "CS1–CS2" computed from the capacities CS1 and CS2 achieved by both the movable electrodes 24 and the fixed electrodes 32 and 42.

Referring to FIGS. 4A and 4B, and 5A to 5C showing some typical steps realized during the manufacturing thereof according to the present invention, a method of manufacturing the sensor S1 will now be described. Those figures are depicted pictorially based on the illustration shown in FIG. 3.

Figure 4A:
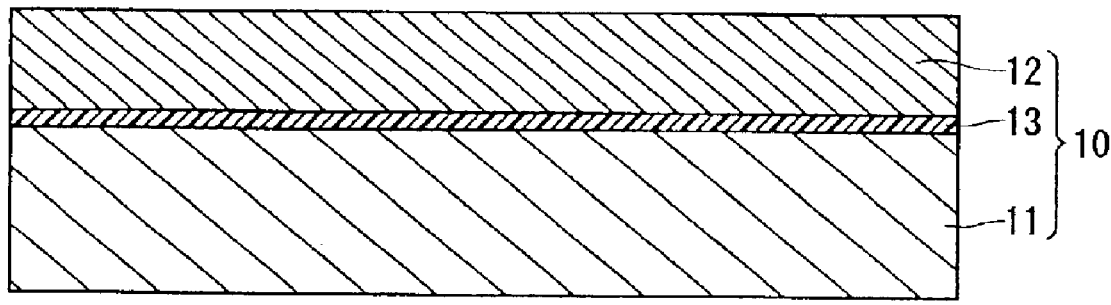
FIGS. 4A and 4B explain some of the steps of manufacturing the acceleration sensor according to the first embodiment.

First, as shown in FIG. 4A, an SOI substrate (i.e., a semiconductor substrate) 10 is prepared, in which an oxide layer 13 (i.e., an insulation layer) is layered on a first silicon layer 11 (i.e., a first semiconductor layer) and a second silicone layer 12 (i.e., the semiconductor layer that provides an SOI layer) is layered on the oxide layer 13.

The SOI substrate 10 may be produced by employing the first and second silicone layers 11 and 12 each made from the single-crystal silicon having a plane orientation of 100. And the first and second layers 11 and 12 may be pasted to each other with the oxide layer 13 placed therebetween. The oxide layer 13 is composed of a silicone oxide layer of which thickness is 1 μm of thereabouts. Although not shown, to reduce not only a surface resistance value of the frontal surface of the second silicone layer 12 but also a contact resistance value to the Al (aluminum) electrodes 20a, 31a and 41a, phosphorus is made to diffuse in the silicone layer 12 at a high concentration, by way of example.

Figure 4B:
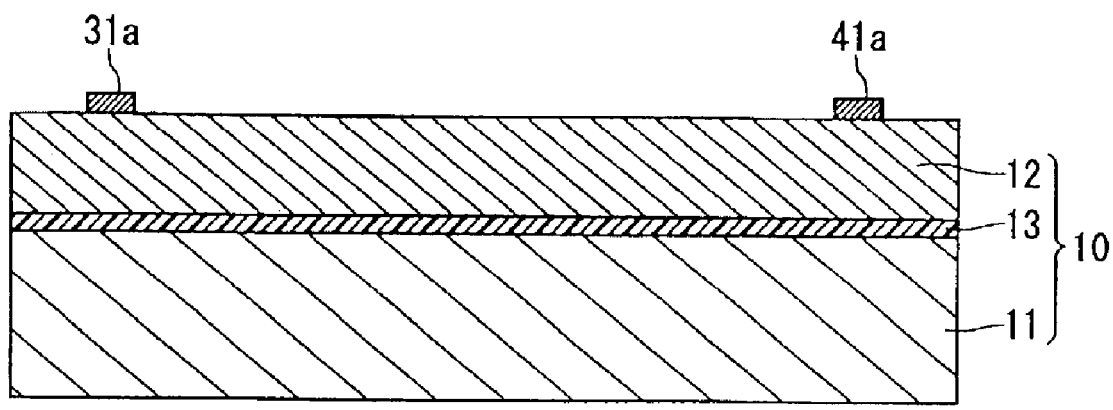

Then, Al is deposited, for example, at a thickness of 1 μm on the second silicone layer 12. As shown in FIG. 4B, followed is photo etching to form the pad electrodes 20a, 31a and 41a for signal line connections on the second silicone layer 12 (though the pad electrode 20a is not depicted in FIG. 4B).

Figure 5A:
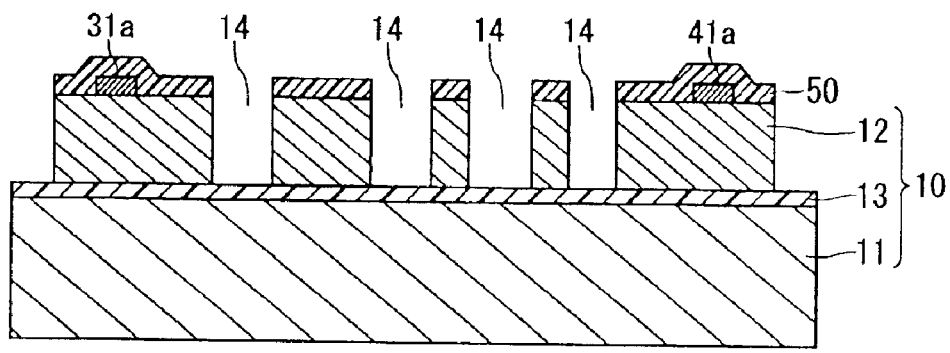
FIGS. 5A to 5C also explain the remaining steps of manufacturing the acceleration sensor according to the first embodiment.

A trench 14 to demarcate the movable and fixed sections 20, 30 and 40 is then formed such that the trench 14 reaches the oxide layer 13 from the surface of the second silicone layer 12, as shown in FIG. 5A (i.e., a trench forming step).

More practically, on the surface of the second silicone layer 12, a mask member 50 having patterns that express comb-tooth-shaped beam structures 20, 30 and 40 is formed with a photo resist or others using a photolithographic technique. A dry etching technique such as plasma etching is then used to form the shape of the trench 14 perpendicular to the oxide layer 13.

The dye etching can be performed by either the technique of ICP (Ion-Coupled Plasma etching) that involves an etching gas $CF_4$, $SF_6$ or others, or the technique of RIE (Reactive Inn Etching) that involves the same or similar gas as or to the above.

Figure 5B:
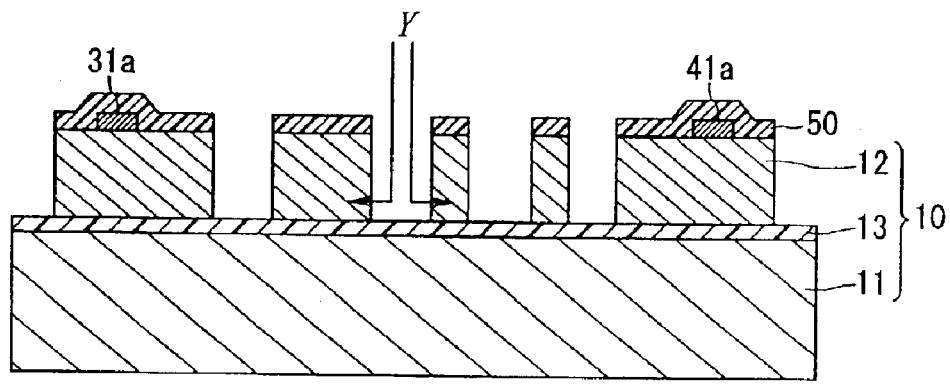
Figure 5C:
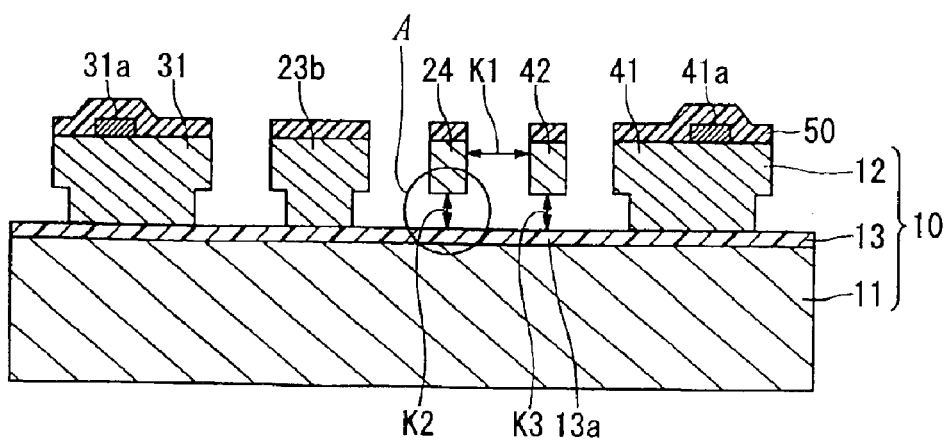

Then, a movable-section forming step follows the above trench forming step. Namely, as shown in FIGS. 5B and 5C, a second process of dry etching is performed so that a movable section 20 is formed, where both of a mass portion 21 with the movable electrodes 24 and beam portions 22 are separated from the oxide layer 13. Through this movable-section forming step, the fixed electrodes 32 and 42, which are included in the fixed sections 30 and 40, are also separated from the oxide layer 13.

FIG. 5C shows only the movable electrodes 24 of the movable section 20 and only the wiring portions 31 and 41 and the fixed electrodes 42, both are part of the fixed sections of 30 and 40.

The dry etching carried out during the movable-section forming step may be performed within the same chamber as that used during the trench-forming step. Etching conditions including the type of an etching gas to be used may be the same or different as or from those for movable-section forming step.

The dry etching carried out during the movable-section forming step involves its etching ions (plasmas of a gas such as $CF_4$ or $CF_6$). The etching ions also cause the surface of an area of the oxide layer 13, which is located at the bottom of the trench 14, to be charged (in general, charged positively). In response to this charging, the successively blown etching ions are subjected to reception of a repelling force on the surface of the changed oxide layer 13, so that the ions are obliged to travel along almost perpendicularly bent courses to the lateral directions, as shown by arrows Y in FIG. 5B.

By the bending of the travel directions, the ions are forced to impinge onto the second silicon layer 12 located laterally to the bottom of the trench 14, with the result that the second silicon layer laterally located is removed by etching, as shown in FIG. 5C. Therefore, both of the movable section 20 and the fixed electrodes 32 and 42 are formed so as to float above the oxide layer 13.

The mask member 50 is then removed, providing the sensor S1 shown in FIGS. 1 to 3. Thus, using the above described method, only the work done from one side of the SOI substrate 10 (that is, from the side of the second silicon layer 12) leads to, with ease, the manufacturing of the movable section 20 and the fixed sections 30 and 40.

As stated above, the dry etching in the movable-section forming step makes the surface of a partial region of the oxide layer 13 located at the bottom of the trench 14 charged responsively to etching ions. Hence, not merely the movable section 20 but also the second silicone layer 12 and the oxide layer 13 which face the movable section 20 via the trench (that is, the fixed sections 30 and 40) are easier to be charged as well.

Such charging, if really caused, may lead to imbalanced charges among the members, providing a fear that the movable section 20 sticks to the members opposed to the movable section 20 (i.e., the phenomenon of sticking). For example, as shown by arrows K1 and K2 in FIG. 5C, the movable electrode 24 may adhere to the fixed electrode 42 and/or the oxide layer 13.

In cases where such sticking is caused actually, the sensor characteristics are influenced from various aspects. For instance, the displacement characteristic of the movable section 20 is changed. Instead of or concurrently with this change, detection spacings between the movable electrodes 24 and the fixed electrodes 32 and 42 may disappear, at least partly.

In addition, as shown in FIG. 3, the fixed electrodes 32 and 42 of the fixed sections 30 and 40 are floated over the oxide layer 13. Thus, there is a possibility that the foregoing charging allows each of the fixed 14<electrodes 42 to stick to a partial region 13a of the oxide layer 13 facing the fixed electrodes 42, as shown by an arrow K3 in FIG. 5C. This sticking, if it really occurs, leads to unfavorable situations, such as changes in the facing area between the movable electrodes 24 and the fixed electrodes 42.

The sticking phenomena attributable for the charging and caused between the movable section 20 and the fixed electrodes 32 and 42 will be suppressed or eliminated in the present embodiment. Specifically, the manufacturing method according to the present invention adopts the way of removing electric charges caused together with the charging of the oxide layer 13 conducted during the movable-section forming step. Such electric charges appear on the movable section 20; partial regions of the fixed sections 30 and 40 made of the second silicon layer 12, the partial regions facing the movable section 20; or partial regions 13a of the oxide layer 13, the partial regions facing the movable section 20 and/or the fixed electrodes 32 and 42.

Accordingly, though the foregoing section and partial regions; 20, 30, 40 and 13a are temporarily charged during the movable-section forming step, the electric charges on each of the section and partial regions are removed by use of techniques detailed later. Hence it is possible to prevent or suppress the movable section 20 and/or the fixed electrodes 32 and 42 from sticking to their surroundings.

For removing the electric charges, it is of course ideal that the electric charges are removed completely. In the case that such a complete removal of electric charges are difficult, a second best way is to remove electric charges at a level at which the movable section 20 and/or fixed electrodes 32 and 42 are at least released from the sticking action to their surroundings.

How to remove such electric charges will now be detailed practically. In the present embodiment, there are various techniques in removing such electric charges. A first technique is that the dry etching is performed in an intermittent manner during the movable-section forming step. Precisely, during the movable-section forming step, after the dry etching is performed during a certain period of time (for example, a few seconds to a few tens of seconds), the dry etching is stopped during a second certain period of time (for example, a few seconds to a few tens of seconds). Thus, the sensor S1 is left with no dry etching during that period of time, during which the electric charges that have been accumulated so far are allowed to disappear from the sensor. The periods with dry etching and without dry etching are repeated cyclically so as to form the intermittent type of dry etching.

When the dry etching is performed based on the above first technique, it is inevitable that electric charges are accumulated during a period of time for the dry etching. However, the electric charges that have been accumulated during the last intermittent dry etching period are allowed immediately after entering the next period of time for no dry etching. Hence the charged state can be avoided at a time when the intermittent cycles for the dry etching are completed (that is, the movable-section forming step are finished), thus preventing the sticking action of the movable section 20 and/or the fixed electrodes 32 and 42.

A second technique is developed from the intermittent type of dry etching sated as the first technique. In other words, the periods of time with no dry etching are utilized so as to administer ions to neutralize the accumulated electric charges during each of such dry-etched intermittent periods. The neutralizing gas includes negative ions such as oxygen ions ($O^{2-}$). Hence, a process of performing the dry etching and a further process of administer ions to neutralize the accumulated electric charges due to the dry etching are repeated alternately, providing more effective removal of the electric charges.

A third technique is addition of a period of time to leave a work to stand. More concretely, after the movable-section forming step, a work is left to stand for a predetermined period of time necessary for remove the electric charges. Such period of time is for example a few tens of seconds. In this case, immediacy after the movable-section forming step, electric charges are accumulated on the movable section 20 and/or fixed electrodes 30 and 40, as described before. However, leaving the work to stand permits the accumulated electric charges to be released from the movable section 20 and/or fixed electrodes 30 and 40, thus preventing the sticking of the those members.

A fourth technique is addition of a period of time to administer neutralizing ions of the electric charges. Namely, after the movable-section forming step, ions for neutralizing the electric charges are administered for a certain period of time. Hence this way is also effective in removing the electric charges from the movable section 20 and/or fixed electrodes 30 and 40, whereby preventing the sticking of the those members.

In the movable-section forming step based on the foregoing first to fourth techniques, leaving a work to stand or administering ions to neutralize electric charges can be done without moving the work from the chamber of a dry etching apparatus.

It is also possible to determine, through various approaches, whether a desired amount of electric charges, which is necessary for a predetermined reduction in the electric charges, has been removed or not. Such approaches include management of a period of time during which a work is left to stand or neutralizing ions are administered. A necessary period of time for leaving a work to stand or a necessary period of time for administering neutralizing ions can be determined previously with a capacitor checker or others.

A fifth technique is to place a conductive member on given partial regions during the trench forming step. Such given partial regions are partial regions selected from the surface of the second silicone layer, the partial regions being opposed to at least the movable section 20, or regions providing regions 30 and 40 selected from the surface of the second silicone layer 12, the regions being oppose to the movable section 20.

In the present embodiment, the foregoing mask member 50 can also be used as the conductive member. The mask member 50, which serves as the conductive member as well, is made of conductive materials. The conductive materials include a resist that contains a metal layer (for example, an Al-made film or a platinum-made film formed with a vapor evaporation technique or a sputtering technique) or a conductive material (for example, carbon).

The conductive member 50 is effective, because the electric charges that try to be accumulated on the foregoing partial regions formed during the movable-section forming step can be released in a positive and effective manner. This structure is able to prevent the movable section 20 and/or the fixed electrodes 32 and 42 from being stuck to their surroundings. Incidentally, it is unnecessary to place the conductive member 50 onto the anchor portions 23a and 23b and the wiring portions 31 and 32 of the fixed electrodes, which are located on the surface of the second silicone layer 12, because those portions have no relation to the sticking.

In addition, any two or more techniques properly selected from the foregoing first and fifth techniques may be carried out in a combined fashion. The selectable and combinable techniques are clear from the foregoing explanations.

Second Embodiment

Figure 6:
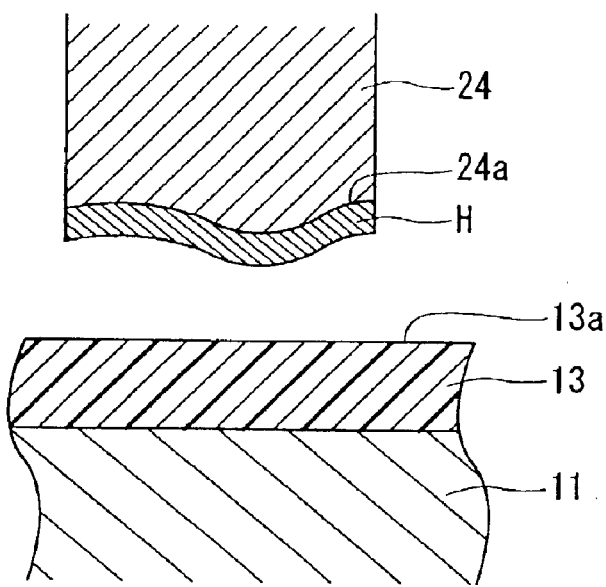
FIG. 6 is adopted to explain a second embodiment of the present invention, which illustrates deposits formed on a certain surface of a movable section, the surface being opposed to an oxide layer.

Referring to FIG. 6, a second embodiment of the present embodiment will now be described.

The second embodiment is directed to suppression of the sticking of the movable section 20 on account of substances deposited on a partial region, which faces the oxide layer 13, of the movable section 20 during the movable-section forming step. In contrast, the foregoing first embodiment was to suppress the sticking action of the movable section 20 caused due to the charging during the movable-section forming step. In the present second embodiment, only the different constituents from the first embodiment will be described.

The manufacturing method according to the second embodiment includes a cleaning process, which is added to the manufacturing method of the sensor S1 explained in the first embodiment. The cleaning process is responsible for cleaning up a partial region, which faces the oxide layer 13, of the movable section 20, after the trench and movable-section forming steps. As a modification, the process of removing the electric charges explained in the first embodiment may be executed before or after this cleaning process.

FIG. 6 shows a state in which substances H are deposited on a region 24a, which faces the oxide layer 13, of the movable section 20. FIG. 6 is an enlarged view of an encircled portion A in FIG. 5C. As shown in FIG. 6, deposits H generated due to etching ions are layered on the region 24a, which faces the oxide layer 13, of a certain movable electrode 24 of the movable section 20. The deposits H are, for example, polymers containing fluorine, carbon and oxygen.

If the deposits are formed on the movable electrode 24, the distance between the mutual opposed regions 24a and 13a of the movable electrode 24 and the oxide layer 13 is shortened. Alternatively, coming away the deposits H from the movable electrode 24 makes it easier that both the movable electrode 24 and the oxide layer 13 stick to each in the spacing existing therebetween. In addition, the thickness of the movable electrode 24 becomes larger by a thickness of the deposits H, thereby disturbing movements of the movable section 20 or changing the amounts of the facing areas to the fixed electrodes 32 and 42. These become unstable factors to the sensor characteristics.

The manufacturing method according to the second embodiment is also directed to the prevention of such inconveniences. Practically, like the first embodiment, the trench and movable-section forming steps are performed to form the movable section 20. A cleaning process is then performed, in which ions such as oxygen ions that have the capability of moving organic substances are administered, for example, in the vapor phase, into the chamber used for the dry etching. This administration thus makes it possible to remove the deposits H on the region 24a, facing the oxide layer 13, of the movable section 20 so that such facing regions are cleaned up.

The foregoing problems resulting from the deposits H (such as, the sticking phenomena of the movable section) can therefore be prevented with steadiness. Any kind of ions may be selected for the cleaning process, as long as such selected ions have the capability of causing, at least, a chemical reaction to remove the deposits H.

It might be possible that the ions for the cleaning might be administered in the liquid phase, but this way is not so recommended. Because, if the ions are administered in the liquid phase, there is a possibility of causing the sticking of the movable section 20 and others due to the surface tension generated when the liquid is dried.

Third Embodiment

Figure 7:
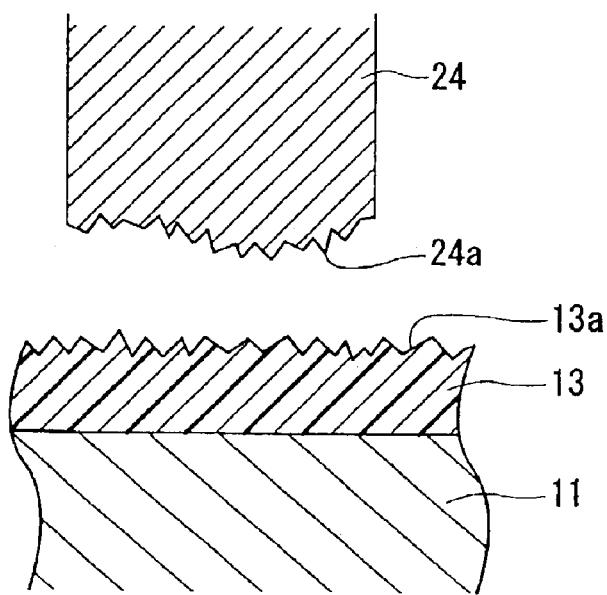
FIG. 7 explains one step for manufacturing a semiconductor acceleration sensor, adopted as a semiconductor devise, according to a third embodiment of the present invention.

Referring to FIG. 7, a third embodiment of the present invention will now be described.

In the third embodiment, like the first embodiment, an object is to suppress the sticking action of the movable section due to the charging occurring in the movable-section forming step. Configurations different from those in the first embodiment will now be described mainly.

The manufacturing method according to the third embodiment includes a roughing process, which is added to the manufacturing method of the sensor S1 explained in the first embodiment. The roughing process is responsible for roughing the facing surface of at least one of the movable section 20 and the oxide layer 13 after the trench and movable-section forming steps. Such facing surfaces, which face to each other, provide part of the surfaces of the movable section 20 and the oxide layer 13. As a modification, the process of removing the electric charges explained in the first embodiment may be executed before or after this roughing process.

FIG. 7, which shows another enlarged view of the encircled portion A in FIG. 4C, explains the roughing process adopted in the manufacturing method according to the third embodiment.

Practically, like the first embodiment, the trench and movable-section forming steps are performed to form the movable section 20. The roughing process is then performed, where ions such as fluorine ions that have the capability of etching a silicone layer or an oxide film are administered into the chamber used for the dry etching.

As pictorially shown in FIG. 7, this administration thus makes it possible to roughen both of the facing surfaces 24a of the movable electrodes 24 and the facing surface 13a of the oxide layer 13 at the mutually-facing portions between the movable electrodes 24 of the movable section 20 and the oxide layer 13. The roughing reduces the contact areas of the facing surfaces 24a and 13a. The contact areas are mutually contacted surface areas realized when both the movable electrodes 24 and the oxide film 13 stick to each other due to the foregoing charging. If such a contact occurs because of such sticking, a reduction in the contact areas allows a slight restoration force to separate both of the members from each other, thus preventing the sticking of the movable section 20.

As a further modification, of the facing surfaces 24a and 13a, only the facing surfaces 24 of the movable electrodes 24 of the movable section 20 may be roughened or only the facing surface 13a of the oxide layer 13 may be roughened. The former roughing configuration can be realized by conducting the roughing process in the vapor phase containing ions that permit only the second silicon layer 12 to be etched, during which the oxide layer 13 is hardly etched. For the latter rouging configuration, the opposite way is taken, in which the roughing process is conducted in the vapor phase containing ions that permit only the oxide layer 13 to be etched substantially.

Other Embodiments

The fixed electrodes 32 and 42 may be used in a state that they are connected to the oxide layer 13, without being separated from the oxide layer 13. For instance, the beam width of each of the fixed electrodes 32 and 42 is set to be wider than that of each of the movable electrodes 24, and then a residual part still connected to the oxide layer 13 is left on each fixed electrode when the dry etching is completed in the movable-section forming step.

The present invention can be applied to various other semiconductor devices each having the movable section described above. Such devices include an angular velocity sensor and a pressure sensor, other than the acceleration sensor.

The present invention may be embodied in other specific forms without departing from the spirit or essential characteristics thereof. The present embodiments are therefore to be considered in all respects as illustrative and not restrictive, the scope of the present invention being indicated by the appended claims rather than by the foregoing description and all changes which come within the meaning and range of equivalency of the claims are therefore intended be embraced therein.

What is claimed is:

1. A semiconductor device comprising:
   a substrate including:
      a first semiconductor layer;
      an insulation layer formed on the first semiconductor layer; and
      a second semiconductor layer formed on the insulation layer and having a trench extending to the insulation layer from a surface of the second semiconductor layer;
   a plurality of anchor portions secured on the insulation layer;
   a movable section formed in the trench and including a mass portion supported on opposite ends thereof by the plurality of anchor portions via beam portions;
      a plurality of first electrodes integrally formed with the mass portion and protruding therefrom; and
   a plurality of fixed sections formed in the trench, each of the fixed sections including a wiring portion secured on the insulation layer and a plurality of second electrodes integrally formed with the wiring portion and protruding therefrom to interleave with the plurality of first electrodes;
   wherein the plurality of first electrodes is displaceable in response to an applied dynamic quantity, and at least one of the anchor portions and the wiring portion of each of the plurality of fixed sections has a bottom-most portion that is narrower than a surface portion thereof.

2. The semiconductor device of claim 1, wherein a region of the movable section that faces the insulation layer is separated from the insulation layer.

3. The semiconductor device of claim 1, wherein each of the plurality of fixed sections is connected to the insulation layer.

4. The semiconductor device of claim 1, wherein the trench is void of electric charges caused due to charging of the insulation layer.

5. A semiconductor device comprising:
   a substrate including a first semiconductor layer, an insulation layer formed on the first semiconductor layer and a second semiconductor layer formed on the insulation layer, the substrate defining a trench reaching the insulation layer from a surface of the second semiconductor layer;
   a plurality of anchor portions secured on the insulation layer;
   a movable section including a mass portion supported on opposite ends thereof by the plurality of anchor portions via beam portions and a plurality of first electrodes integrally formed with the mass portion and protruding therefrom, the mass portion and the beam portions being separated from the insulation layer in the trench and being displaceable in response to an applied dynamic quantity; and
   fixed sections each including a wiring portion secured on the insulation layer and a plurality of second electrodes integrally formed with the wiring portion and protruding therefrom to interleave with the plurality of first electrodes;
   wherein at least one of opposing surfaces of the movable section and the insulation layer is roughened.

6. The semiconductor device of claim 5, wherein the trench is void of electric charges.

* * * * *

UNITED STATES PATENT AND TRADEMARK OFFICE
CERTIFICATE OF CORRECTION

PATENT NO. : 6,906,394 B2
APPLICATION NO. : 10/448277
DATED : May 30, 2003
INVENTOR(S) : Hiroshi Muto et al.

It is certified that error appears in the above-identified patent and that said Letters Patent is hereby corrected as shown below:

Title Page

Correct the title in item (54) and column 1, line 1 to read.

--SEMICONDUCTOR DEVICE CAPABLE OF SENSING DYNAMIC QUANTITY--

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,906,394 B2 | Page 1 of 1 |
| APPLICATION NO. | : 10/448277 | |
| DATED | : June 14, 2005 | |
| INVENTOR(S) | : Hiroshi Muto et al. | |

It is certified that error appears in the above-identified patent and that said Letters Patent is hereby corrected as shown below:

Title Page

Correct the title in item (54) and column 1, line 1 to read.

--SEMICONDUCTOR DEVICE CAPABLE OF SENSING DYNAMIC QUANTITY--

This certificate supersedes Certificate of Correction issued August 29, 2006.

Signed and Sealed this

Seventh Day of November, 2006

JON W. DUDAS
*Director of the United States Patent and Trademark Office*